United States Patent
Takahashi

(10) Patent No.: US 7,147,447 B1
(45) Date of Patent: Dec. 12, 2006

(54) PLASTIC SEMICONDUCTOR PACKAGE HAVING IMPROVED CONTROL OF DIMENSIONS

(75) Inventor: Yoshimi Takahashi, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/190,703

(22) Filed: Jul. 27, 2005

(51) Int. Cl.
*H01L 21/56* (2006.01)
*B29C 45/14* (2006.01)

(52) U.S. Cl. ............... 425/89; 425/116; 425/125; 425/127; 425/129.1

(58) Field of Classification Search ............... 425/89, 425/116, 125, 127, 129.1, 544
See application file for complete search history.

(56) References Cited

U.S. PATENT DOCUMENTS

| | | | |
|---|---|---|---|
| 6,261,501 B1 * | 7/2001 | Miyagawa et al. | 264/272.15 |
| 6,344,162 B1 * | 2/2002 | Miyajima | 264/272.14 |
| 6,511,620 B1 * | 1/2003 | Kawahara et al. | 264/40.5 |
| 2001/0013674 A1 * | 8/2001 | Shimizu et al. | 264/511 |
| 2002/0015748 A1 * | 2/2002 | Miyajima et al. | 425/89 |
| 2002/0025352 A1 * | 2/2002 | Miyajima | 425/89 |

FOREIGN PATENT DOCUMENTS

JP  2000202864 A  *  7/2000

* cited by examiner

*Primary Examiner*—Robert B. Davis
(74) *Attorney, Agent, or Firm*—Yingsheng Tung; Wade James Brady, III; Frederick J. Telecky, Jr.

(57) ABSTRACT

A device with a semiconductor chip (801) assembled on a planar substrate (802) and encapsulation compound (810) surrounding the assembled chip and a portion of the substrate near the chip; the compound has a planar top area (811). The encapsulation compound has a plurality of side areas (812) reaching from the substrate to the top area; these side areas form edge lines with the top area, where the top area plane intersects with the respective plane of each side area. The encapsulation compound is recessed (813) along the edge lines so that the material is caved-in along the lines; this feature causes the recess to prevent any compound from the side area planes to reach the top area plane, whereby the planarity of the top area is preserved.

4 Claims, 5 Drawing Sheets

PLASTIC SEMICONDUCTOR PACKAGE HAVING IMPROVED CONTROL OF DIMENSIONS

FIELD OF THE INVENTION

The present invention is related in general to the field of semiconductor devices and processes and more specifically to encapsulation methods for integrated circuit chips resulting in thin and substantially flat packages having improved control of dimensions and board assembly properties.

DESCRIPTION OF THE RELATED ART

During the last few years, a major trend in the semiconductor industry has been the effort to shrink semiconductor packages so that the package outline consumes less area and less height when it is mounted onto customer circuit boards, and to reach these goals with minimum cost (both material and manufacturing cost). One of the most successful approaches has been the development of so-called "chip-scale packages". These packages have an outline adding less than 20% to the chip area. A chip-scale package which has only the outline of the chip itself is often referred to as "chip-size package".

The process of encapsulating ship-scale packages has taken two different routes. In one approach, semi-viscous material is distributed from the opening of syringes onto pre-selected regions of the devices surfaces to be covered; the material is then distributed over the whole area and into openings with the help of capillary forces. This technique suffers from several shortcomings. Foremost, the process is hard to control uniformly and prone to statistical variations such as uneven fillings, pronounced meniscus formation, or flaws such as voids. The choice of materials is limited to semi-liquid materials which typically require prolonged "curing" times for polymerization and hardening, causing high mechanical stress in the product. Secondly, the existing technology process is not economical. In order to keep the number of dispensers in practical limits, only a modest number of packages can be encapsulated in one fabrication step; the process does not lend itself to mass production.

Considerable efforts have been expanded to apply the conventional transfer molding technology to produce thin semiconductor products. However, it has proved extraordinarily difficult to produce devices thinner than about 0.8 mm total thickness. The main difficulty has been the adhesion of the molding compound to the cavity walls of the steel molds, which proved to become dominant over the adhesion of the molding compound to the device parts when the molded layers shrink below about 0.2 mm thickness (dependent on the chemistry of the compound).

SUMMARY OF THE INVENTION

Applicant recognizes a need for a low-cost, robust, and operationally reliable mold design and method for fabricating thin, mechanically stable semiconductor devices. A partial solution arrived by preventing the deleterious adhesion to the mold cavity walls of the molding compound with the help of covering the mold cavity walls with thin, continuous plastic films. For this purpose, the pulling forces from vacuum "dispensed" from numerous openings pressure the flexible films against the walls, thus keeping the molding compound away from the walls.

For chip-scale packages and especially for thin devices, these features may be achieved by the compression mold technique. The mold itself has to be designed so that the contours of the finished product do not exhibit unwanted deviations from the desired geometries; especially, consistent device thickness and height are to be insured. Further, the mold design has to provide a molding process, which keeps any process built-in stress to a minimum, so that the finished products will exhibit only minimum warping in applications involving elevated temperatures.

One embodiment of the invention is a device, which has a semiconductor chip assembled on a planar substrate. Encapsulation compound surrounds the assembled chip and a portion of the substrate near the chip; the compound has a planar top area. The encapsulation compound has further a plurality of side areas reaching from the substrate to the top area; these side areas form edge lines with the top area, where the top area plane intersects with the respective plane of each side area. The encapsulation compound is recessed along the edge lines so that the material is caved-in along the lines; this feature causes the recess to prevent any compound from the side area planes to reach the top area plane, whereby the planarity of the top area is preserved.

Another embodiment of the invention is an apparatus for packaging a semiconductor device, wherein the package has planar top and side areas. A mold has top and bottom portions to form a cavity for holding a semiconductor chip pre-assembled on a planar substrate. The bottom mold portion is constructed to accommodate the substrate. The top mold portion has a center die to define the planar top area of the package, and a side die to rest on the substrate and to define the planar side areas of the package. A gap with a width separates the center die from the side die. Protruding members are along the perimeter of the center die; the members extend toward the cavity and have a height approximately equal to the width of the gap.

Other embodiments add protrusions of the side die to enlarge the resting area against the substrate. The protrusions are at a plurality of selected die locations so that the die can clamp the substrate more forcefully against the bottom mold portion during the packaging process.

Another embodiment of the invention is a method for encapsulating a semiconductor device. A mold is provided, which has top and bottom portions to form a package having planar top and side areas. The top mold portion has a center die to define the planar top area of the package, and a side die to define the planar side areas of the package. The center die is separated from the side die by a gap, which has a width and further has protruding members along the die perimeter, wherein the members extend toward the cavity and have a height approximately equal to the width of the gap. The top cavity portion is lined with a protective plastic tape. This tape is pulled tight to the contours of the top mold portion by applying vacuum to the gap, whereby the tape is caused to line the center die members before bridging the gap. Semiconductor chips are provided pre-assembled on a substrate. The substrate is positioned on the bottom mold portion, so that the chips face away from the bottom mold. A pre-determined amount of low-viscosity encapsulation compound is dispensed over the chips to cover the chips and portions of the substrate near the chips. The top mold portion is closed by clamping the top portion onto the bottom portion, whereby the tape forms a seal surrounding the substrate. The encapsulation compound is shaped to follow the contours of the tape; the planarity of the top package area is preserved by preventing any compound form the side area planes to reach the top area plane.

It is a technical advantage that the invention provides thin devices free of any voids and having unusually flat surfaces and high luster. Furthermore, the production throughput is about an order of magnitude higher compared to conventional potting encapsulation.

It is another technical advantage that the invention can be applied to a wide variety of different semiconductor devices, especially thin packages. The release from the mold press exerts hardly any stress on the finished devices and they exhibit noticeably reduced warping in board assembly. Furthermore, the low modulus molding compound and compression molding technique minimize wire sweep.

The technical advantages represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 10A illustrates the imprint with an embodiment of the invention.

FIG. 10B is the imprint of a conventional mold portion.

DETAILED DESCRIPTION OF THE PREFERRED EMBODIMENTS

Figure 1A:
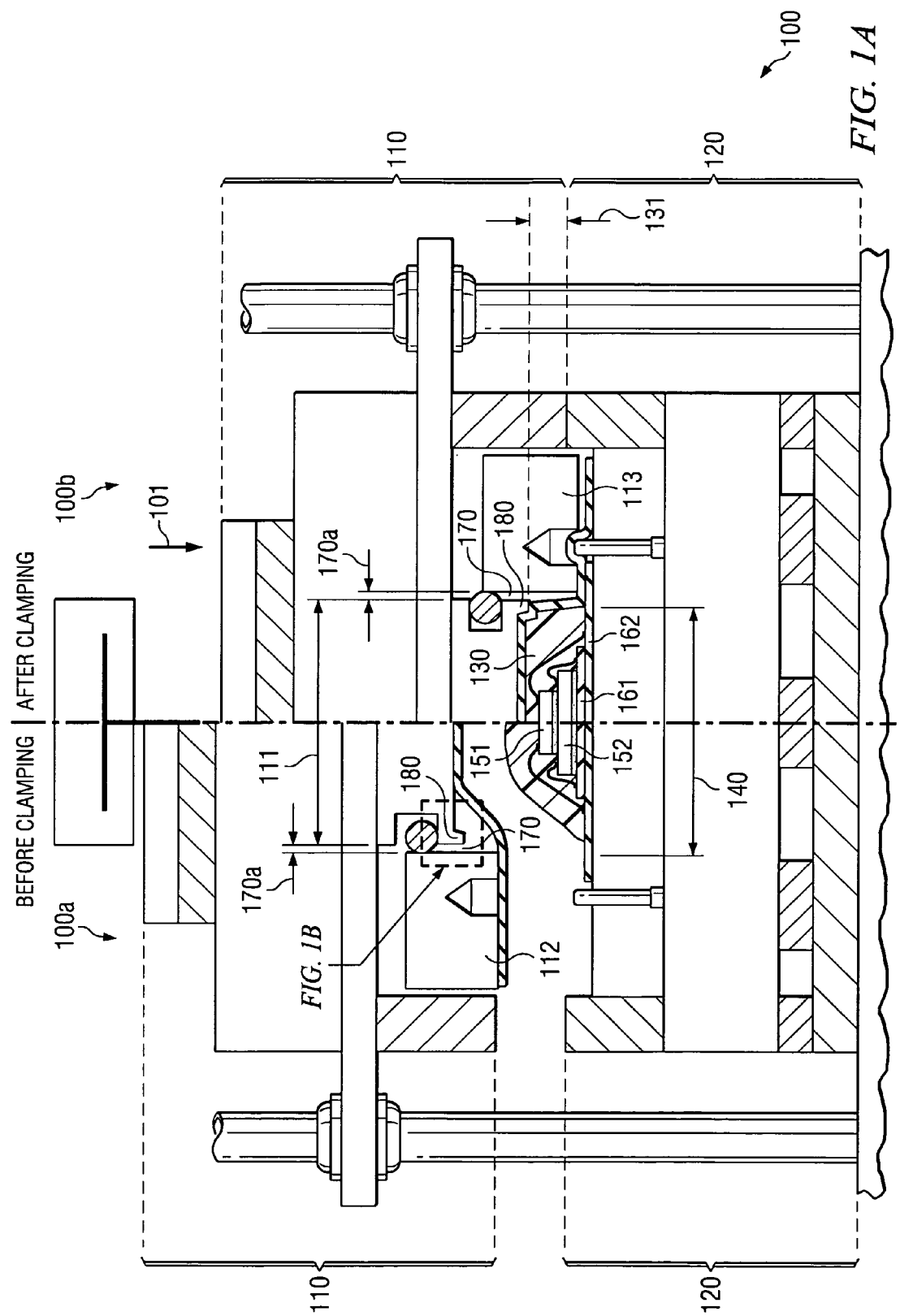
FIG. 1A depicts a schematic cross section of a compression mold, the left half of FIG. 1A before clamping, the right half of FIG. 1A after clamping. The top portion of the mold includes features of the invention.

FIG. 1A depicts an apparatus, generally designated 100, for packaging a device, especially a semiconductor device, according to one embodiment of the invention. The package of the device is intended to have a planar top area and planar side areas. The apparatus of FIG. 1A is designed for the compression molding technique as the preferred technology to utilize the innovations of the invention. It should be stressed, however, that an apparatus suitable for a transfer molding technique or a potting technique may also incorporate features of the invention. The left hand portion 100a of the apparatus in FIG. 1A illustrates the apparatus before the process step of clamping, the right hand portion 100b illustrates the apparatus after the process step of clamping, whereby the direction of the clamping step is indicated by the arrow 101. An apparatus for the compression molding technique, which can be fitted with a top mold embodying this invention as shown in FIG. 1A, is commercially available for instance from the company Yamada, Japan.

The apparatus of FIG. 1A contains the mold with its top portion 110 and its bottom portion 120. After the clamping step illustrated in the right hand portion 100b, the top portion 110 and the bottom portion 120 form a cavity 130 of height 131 and width 140 to hold at least one semiconductor chip, pre-assembled on a planar substrate. In the example of FIG. 1A, a stack of chips 151 and 152 is shown on a stack of substrates 161 and 162, each chip connected by wires to its respective substrate.

The bottom portion 120 of the mold is constructed to accommodate the substrate. The top portion 110 of the mold has a center die 111 to define the planar top area of the package (in FIG. 1A, top portion 111 is shown in two sections because of the clamping action illustrated in FIG. 1A). Further, top mold portion 110 has side dies 112 and 113, which rest on the substrate 140 after the clamping action and define the planar side areas of the package.

Figure 1B:
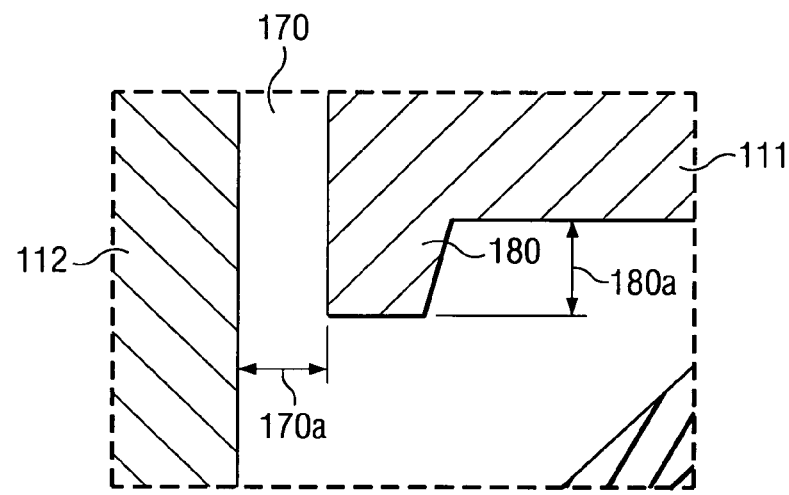
FIG. 1B is a magnified cross sectional view of a portion of the top mold, which depicts an embodiment of the invention in detail.

As shown in FIG. 1A, and magnified in FIG. 1B, there is a gap 170 separating the center die 111 from the side dies 112 and 113. Gap 170 has a width 170a. Along the perimeter of center die 111, and thus facing gap 170, are protruding members 180 of the center die. As FIG. 1B shows, members 180 extend towards the cavity 130 and have a height 180a approximately equal to the width 170a of the gap 170. For many semiconductor package types, the preferred height 180a of members 180 is between about 100 and 400 µm. For several package types the most preferred member height 180a is about 300 µm.

Figure 2:
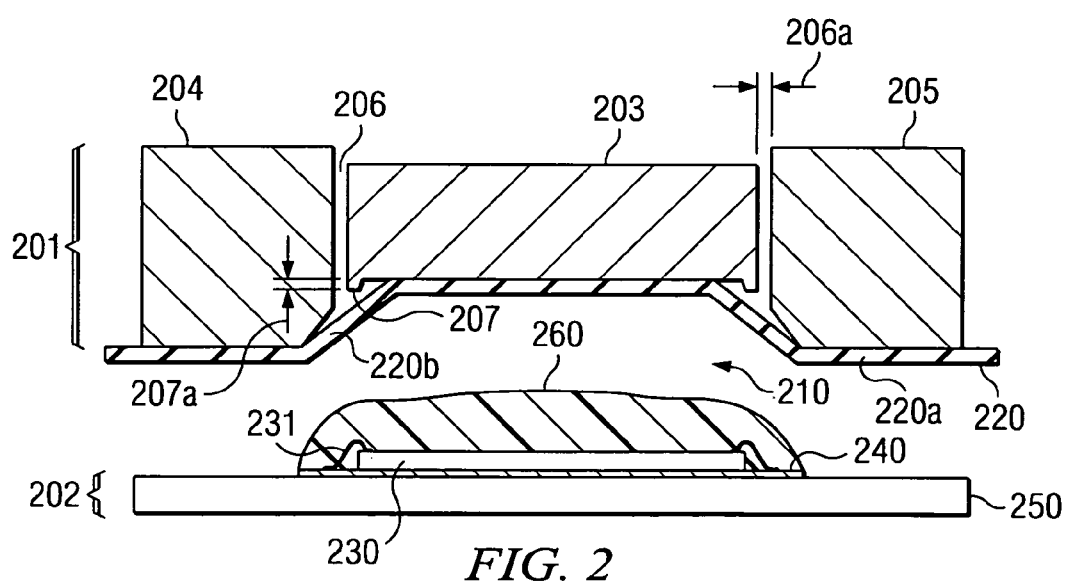
FIG. 2 is a schematic cross section of a portion of a compression mold having an embodiment of the invention, and an assembled semiconductor device covered with low-viscosity encapsulation compound.

FIGS. 2 to 6 depict portions a mold to illustrate selected steps in the process flow for encapsulating a device, especially a semiconductor device; the process steps utilize features of the inventions. As shown in FIG. 2, the encapsulation method starts with the step of providing a mold having top portion 201 and bottom portion 202 to form a cavity 210 for creating a package having planar top and side areas. The top mold portion 201 has a center die 203 to define the planar top area of the package, and side dies 204 and 205 to define the planar side areas of the package. The center die 203 is separated from the side dies by a gap 206, which has a width 206a.

The center die 206 further has protruding members 207 along the die perimeter. The members extend toward the cavity 210 and have a height 207a approximately equal to the width 206a of the gap 206.

In the next process step, the top mold portion 201 is lined on the side facing cavity 210 with a protective plastic tape 220 made of inert polymer material. This tape insures that the compression-molded package will not adhere to the surface of the mold (usually steel); the finished package will thus easily be released, and further the mold does not need to be cleaned after the molding process.

As FIG. 2 indicates, tape 220 lines smoothly across flat surfaces (tape portions 220a), but stretches somewhat loose across corners and other uneven surface portions (tape portions 220b). In order to pull tape 220 tight along all contours of the top mold portion 201, a vacuum is applied to gap 206. The sucking force of this vacuum pulls on tape portions 220b and causes tape portions 220b to line tight on all contours of dies 203, 204 and 205.

Figure 3:
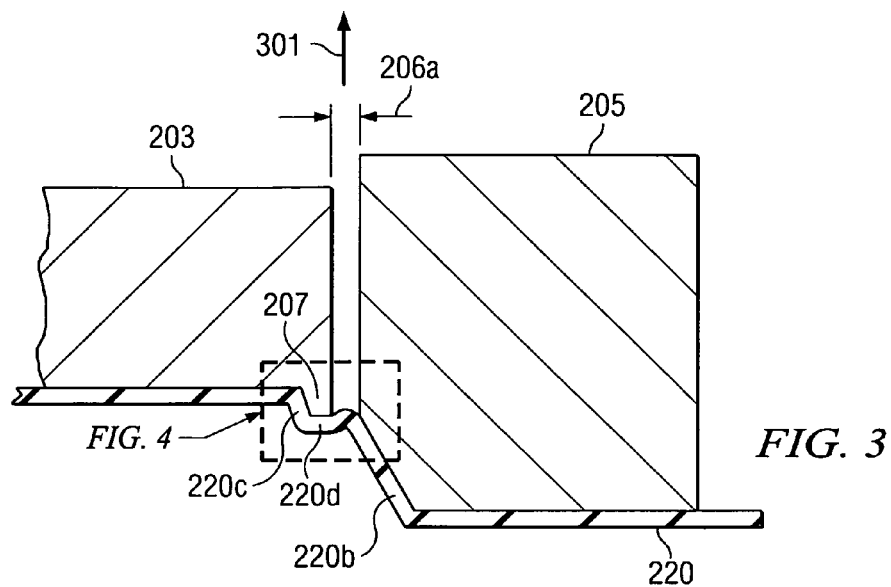
FIG. 3 is a schematic cross section of a part of the top portion of a compression mold illustrating embodiments of the invention.

FIG. 3 illustrates in more detail the lining of tape portions 220b in the proximity the members 207 of center die 203 (identical parts are identified by the same numbers as in FIG. 2). The applied vacuum 301 forces tape 220 to lay tight on the surface of member 207 extending toward cavity 210, forming tape portion 220c. The vacuum further forces tape 220 to bridge the width 206a of the gap, forming tape portion 220d. The exact shape of tape portion 220d depends on the elastic strength of the tape and the force of the vacuum.

Figure 4:
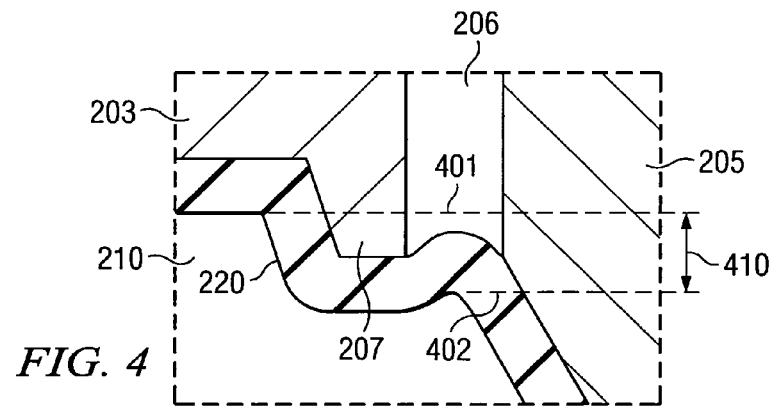
FIG. 4 is a magnified cross sectional view of the portion "A" in FIG. 3.

FIG. 4 is a magnification of the portion marked "A" in FIG. 3. It shows the member 207 of center die 203 (the member facing cavity 210), further gap 206 between center die 203 and top die 205, and tape 220 in an average shape as resulting from the strength of the polymer material and the vacuum force. Considering the final shape of the tape and the tape surface extending toward cavity 210, it should be noted that a significant distance 410 has developed between higher level 401 of the tape on center die 203 and lower level 402 of the tape at the maximum bulge in the gap 206. Due to distance 410 caused by the height of member 207, level 402 is no higher than level 401, and the cavity 210 retains its highest level at level 401.

Figure 5:
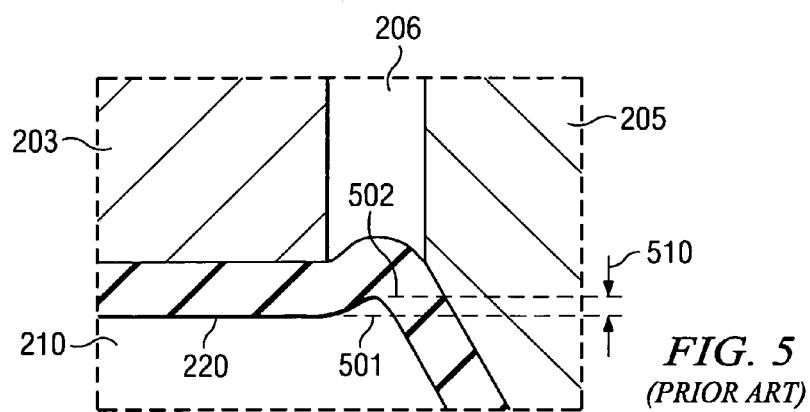
FIG. 5 is a magnified cross sectional view of the portion "A" in FIG. 3 according to conventional technology.

This result is in contrast to the conventional situation, illustrated in FIG. 5 for a mold portion analogous to portion "A" in FIG. 4. Member 207 of the invention is missing. Consequently, level 501 of tape 220 is lower than level 502. Tape 220 forms a bulge of height 510, allowing the cavity 210 to extend beyond the level 501. After cavity 210 is filled with encapsulation compound, the bulge 510 will also be filled with compound, creating an unwelcome tip inconsistent with level 501.

In the next process step, semiconductor chips are provided, pre-assembled on a substrate. Referring to FIG. 2, a chip 230 is shown attached to substrate 240; wire bonds 231 connect the chip bond pads to the substrate contact pads. Substrate 240 is positioned on the bottom mold portion 250 so that chip 230 faces away from the bottom mold 250.

Next, a pre-determined amount of low-viscosity encapsulation compound 260 is dispensed over chip 230 and its wire bonds 231. Compound 260 also covers portions of substrate 240 near the chip. The amount of compound is calculated to fill cavity 210 after the top mold portion is lowered without leaving voids and without overflowing.

Figure 6:
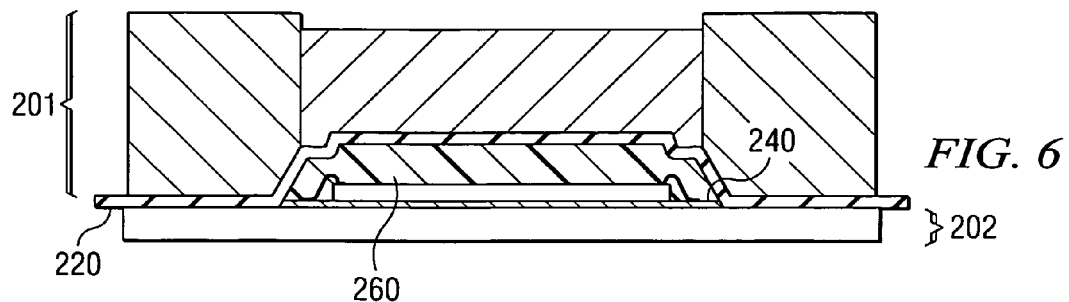
FIG. 6 is a schematic cross section illustrating a step in the molding process with embodiments of the invention.

FIG. 6 illustrates the next process step of closing the top mold portion 201, with tape 220 tightly vacuum-held and clinging to mold portion 201, by clamping the top portion 201 onto the bottom portion 202. In this operation, the tape 220 forms a seal, which surrounds the substrate 240. As FIG. 6 illustrates, this operation pressures and shapes the encapsulation compound 260 to follow the contours of tape 220 as it clings to the top mold portion 201. As a result of this shaping under pressure, the encapsulation compound 260 fills the mold cavity without leaving voids and without overflowing. The compression molding process creates a package with contours faithfully reproducing the contours of tape 220 clinging to top mold 201.

Figure 7:
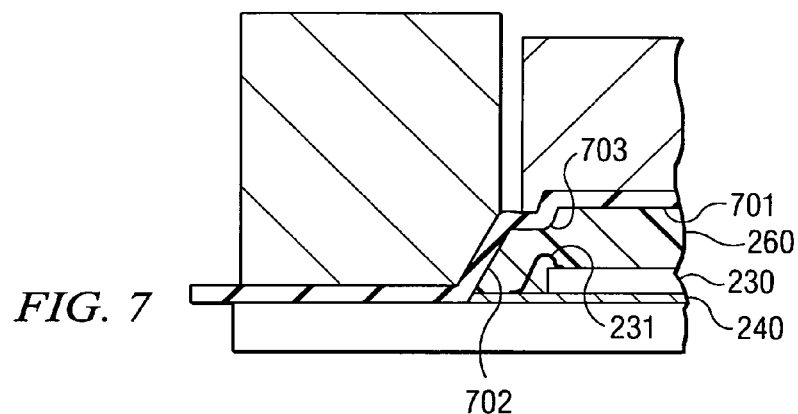
FIG. 7 shows a schematic cross section of a detail of FIG. 4.

FIG. 7 magnifies a portion of the package created by the compression molding process. The molded compound 260, encapsulating chip 230, substrate 240, and wire bond connections 231, has a planar top package area 701. The compound from the side area planes 702 can nowhere reach the top area plane 701. Instead, side planes 702 form edge lines 703 with the top area plane 701, where the top area plane intersects with the respective plane from each side area. Along these edge lines 703, the encapsulation compound 260 is recessed so that the material 260 is caved-in along the lines. Consequently, the recess 703 prevents any compound from the side area planes 702 to reach the top area plane 701. The planarity of the top area is always preserved.

Figure 8:
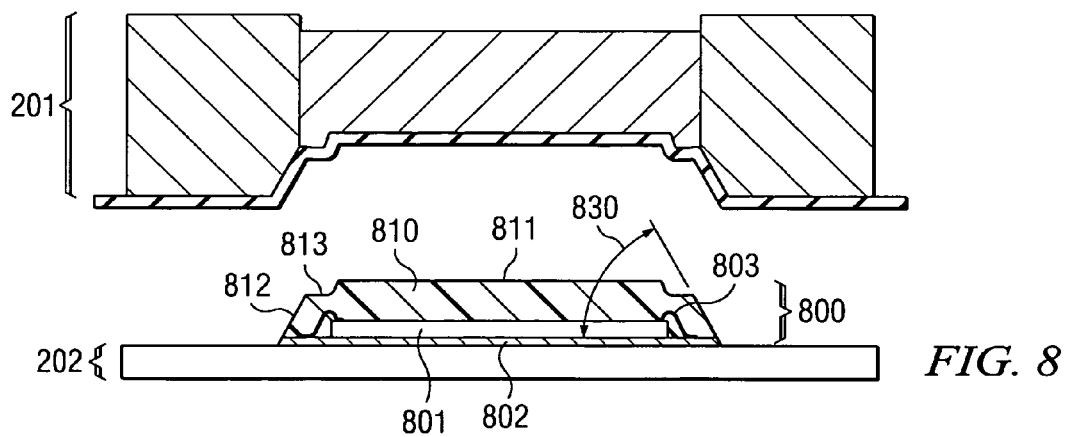
FIG. 8 is a schematic cross section illustrating the molded device after lifting the top portion of the mold.

In the subsequent process steps, the encapsulation compound is allowed to polymerize (to "cure"), at least partially; the device contours are hereby solidified. As shown in FIG. 8, the mold can then be opened by lifting the top mold portion 201. The packaged device 800 can now be removed from the mold.

As the device 800 in FIG. 8 illustrates, the embodiment of the invention comprises a semiconductor chip 801 assembled on a substrate 802; the assembly may include bonding wires 803 interconnecting chip bond pads and substrate contact pads. Alternatively, flip-chip assembly using solder elements may establish the interconnection between chip pads and substrate pads. An encapsulation compound 810 surrounds the assembled chip 801 and at least a portion of the substrate 802 near the chip. Encapsulation compound 810 has a planar top area 811. Compound 810 further has a plurality of side areas 812 reaching from substrate 802 to top area 811. Side areas 812 form edge lines with the top area 811 where the top area plane intersects with the respective plane from each side area. The encapsulation compound is recessed (813) along the edge lines so that the material 810 is caved-in at 813 along the lines. Consequently, the recess 813 prevents any compound from the side area planes to reach the top area plane, whereby the planarity of the top area 811 is preserved.

FIG. 8 indicates that the planar top area 811 of the encapsulation compound is parallel to the planar substrate 802. In many embodiments, the side areas form an angle 830 with the substrate, wherein the angle is 90° or less. For many devices, recess 813 has a depth between about 0.1 and 0.4 mm, with a preferred depth of about 0.3 mm.

Figure 9:
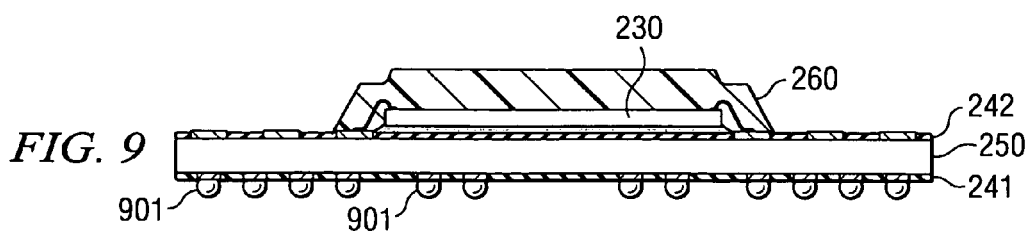
FIG. 9 shows a schematic cross section of a molded semiconductor device incorporating features of the invention.

In order to finish the device (see FIG. 9), an array of solder balls 901 may be attached to the substrate surface 241 opposite to the chip 230. In the example of FIG. 9, substrate 240 is shown to be larger than chip 230 and package compound 260. It should be stressed, however, that in other embodiments, especially in chip-size devices, substrate 240 and package 260 may have substantially the same dimensions. Further, in yet other embodiments, solder balls 901 may also be located on the substrate surface 242 on the same side as chip 230. Finally, it should be pointed out that a singulation step, such as sawing, may be added when substrate 240 originally had the size of a whole wafer.

Another embodiment of the invention is an apparatus for packaging a device, especially a semiconductor device, wherein the package is intended to have a planar top and planar side areas. The preferred application of the apparatus is the compression molding technique, but it is also applicable to other encapsulation techniques. The apparatus consists of a mold having top and bottom portions to form a cavity for holding an object such as a semiconductor chip pre-assembled on a planar substrate. The bottom mold portion is constructed to accommodate the substrate.

The top mold portion has a center die to define the planar top area of the package, and a side die to rest on the substrate and to define the planar side areas of the package. A gap of pre-determined width separates the center die from the side die. Protruding members are along the perimeter of the center die, wherein the members extend toward the cavity and have a height approximately equal to the width of the gap.

Protrusions of the side die are designed to enlarge the resting area of the side die against the substrate (in FIG. 2, the side dies are designated 205). The protrusions are placed at a plurality of selected die locations so that the die can clamp the substrate more forcefully against the bottom mold portion during the packaging process. As a consequence, the tendency of the substrate to warp at elevated temperatures is reduced.

Figure 10A:
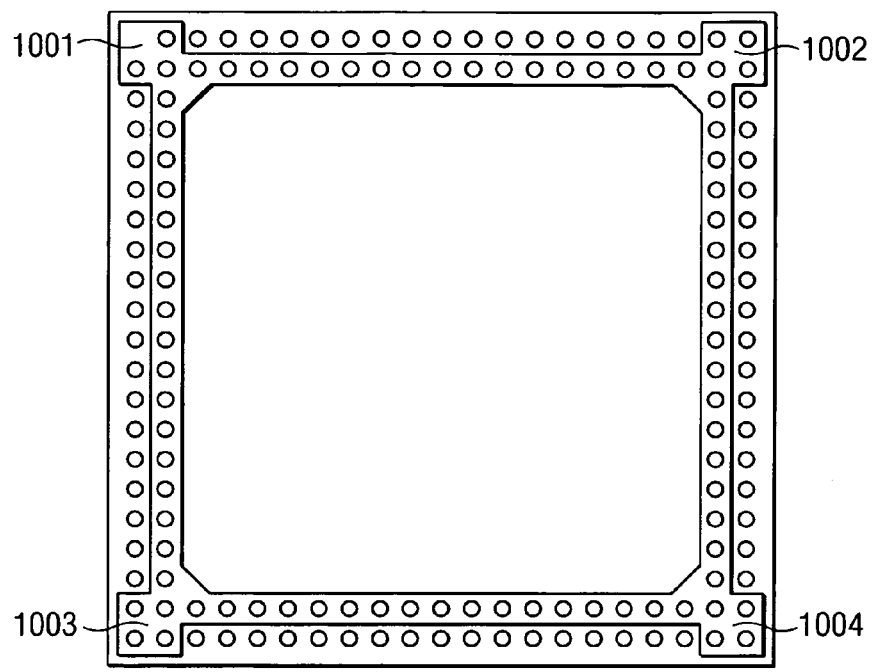
FIGS. 10A and 10B are schematic top views of the clamping imprint of the top portion (side die) of a compression mold.
Figure 10B:
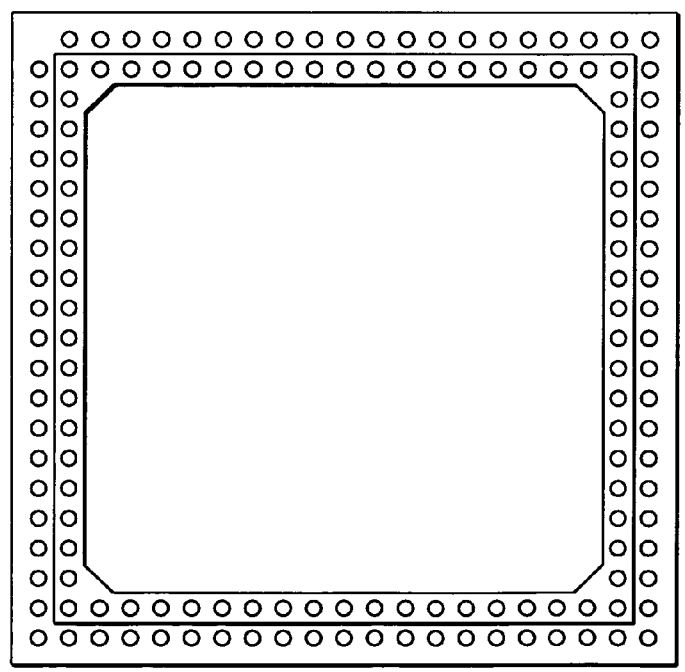

FIG. 10A shows a preferred design of the resting area of a side die against the substrate. The side die protrusions have a castellated configuration, and the locations of the side die protrusions include at least the corners of the substrate; in FIG. 10A, the corner protrusions are designated 1001, 1002, 1003, and 1004. The castellated protrusions as located in the corners of the package substrate enlarge the clamped substrate area between about 5 and 20%, dependent on the area size allotted to the protrusions, as a comparison with the standard technology illustrated in FIG. 10B shows.

For a device type as shown in FIG. 9, the enhanced clamping, enabled by the castellated protrusions, improves the device warpage at the elevated solder reflow temperature during board attach with two respects: First, the maximum device warpage is reduced by about 5 to 15%. Second, the displacement of the substrate in the corner regions is almost completely suppressed. Both improvements contribute to a reliable board attach methodology, where all molten solder balls find their respective partners for reflow without opens.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the protrusions of the side die can be selected in various symmetrical locations, for instance in the center of the sides. As another example, a plurality of devices is submitted for the molding process on a substrate strip and singulated by sawing after completion of the molding process. As another example, the devices to be molded are micromechanical devices wherein the planarity of the top area needs to be preserved for correct attachment of a glass plate. It is therefore intended that the appended claims encompass any such modifications or embodiments.

I claim:

1. An apparatus for packaging a semiconductor device of planar top area and side areas, comprising:
   a mold having top and bottom portions to form a cavity for holding a semiconductor chip pre-assembled on a planar substrate;
   the bottom mold portion constructed to accommodate the substrate;
   the top mold portion having a center die to define the planar top area of the package, and side dies to rest on the substrate and to define the planar side areas of the package;
   a gap separating the center die from the side dies, the gap having a width;
   protruding members along the perimeter of the center die, the members extending toward the cavity and having a height approximately equal to the width of the gap; and
   protrusions of the side die to enlarge the resting area against the substrate, the protrusions at a plurality of selected die locations so that the die can clamp the substrate more forcefully against the bottom mold portion during the packaging process.

2. The apparatus according to claim 1 wherein the side die protrusions have a castellated configuration.

3. The apparatus according to claim 1 wherein the locations of the side die protrusions include at least the corners of the substrate.

4. The apparatus according to claim 3 wherein the castellated protrusions, located in the corners of the package substrate, enlarge the clamped substrate area between about 5 and 20%.

* * * * *